US008564280B2

(12) United States Patent
Loy

(10) Patent No.: US 8,564,280 B2
(45) Date of Patent: Oct. 22, 2013

(54) MECHANICAL PACKAGING AND METHOD FOR A SINGLE CURRENT SENSOR INTEGRATED INTO AN ELECTRICITY METER WITH A DISCONNECT SWITCH

(75) Inventor: Garry M. Loy, Raleigh, NC (US)

(73) Assignee: Elster Solutions, LLC, Raleigh, NC (US)

( * ) Notice: Subject to any disclaimer, the term of this patent is extended or adjusted under 35 U.S.C. 154(b) by 291 days.

(21) Appl. No.: 13/017,619

(22) Filed: Jan. 31, 2011

(65) Prior Publication Data

US 2012/0194174 A1 Aug. 2, 2012

(51) Int. Cl.
- *G01R 1/20* (2006.01)
- *G01R 11/32* (2006.01)
- *G01R 1/38* (2006.01)
- *H02B 1/00* (2006.01)

(52) U.S. Cl.
USPC ........... 324/150; 324/142; 324/115; 324/146; 361/668; 361/659

(58) Field of Classification Search
USPC ......................................................... 324/150
See application file for complete search history.

(56) References Cited

U.S. PATENT DOCUMENTS

| | | | | |
|---|---|---|---|---|
| 1,947,737 | A * | 2/1934 | Pudelko | 324/140 R |
| 3,764,858 | A | 10/1973 | Burkhart, Jr. | |
| 4,276,511 | A * | 6/1981 | Boreas | 324/150 |
| 5,907,461 | A * | 5/1999 | Hartzel et al. | 361/42 |
| 5,933,063 | A * | 8/1999 | Keung et al. | 335/18 |
| 6,400,130 | B2 * | 6/2002 | Berkcan et al. | 324/127 |
| 6,414,475 | B1 | 7/2002 | Dames et al. | |
| 6,816,360 | B2 * | 11/2004 | Brooksby et al. | 361/667 |
| 6,963,195 | B1 * | 11/2005 | Berkcan | 324/117 R |
| 6,972,555 | B2 * | 12/2005 | Balko et al. | 324/142 |
| 7,274,187 | B2 | 9/2007 | Loy | |
| 7,274,553 | B2 * | 9/2007 | Tate et al. | 361/668 |
| 7,423,858 | B2 | 9/2008 | Dobbs et al. | |
| 7,545,135 | B2 * | 6/2009 | Holle et al. | 324/76.11 |
| 7,550,960 | B2 * | 6/2009 | Barbour et al. | 324/72.5 |
| 7,638,998 | B2 * | 12/2009 | Sanderford et al. | 324/110 |
| 2001/0021605 | A1 | 9/2001 | Bolam | |

(Continued)

OTHER PUBLICATIONS

Mobius, "A low cost current sensor", http://www.sentec.co.uk/page/our_products/8/, © 2009, accessed Nov. 9, 2009, 5 pages.

(Continued)

*Primary Examiner* — Jermele M Hollington
*Assistant Examiner* — Christopher McAndrew
(74) *Attorney, Agent, or Firm* — Woodcock Washburn LLP

(57) ABSTRACT

An electricity meter comprises a single current sensor with a toroidal coil that has an inner bore extending substantially through the sensor. The meter also has two current conductors that form one of a pair of line-side blades of the meter. The electricity meter also has a disconnect switch with a pair of moveable contacts and a pair of fixed contacts. One of the pairs contacts is electrically connected to the current conductors. The other pair forms a respective load-side blade of the meter. One current conductor passes through the inner bore of the current sensor in a first direction relative to its line-side blade and the other current conductor passes through the inner bore of the current sensor in a substantially opposite direction relative to its line-side blade so that current passing through the conductors passes through the inner bore of the current sensor in a same direction.

17 Claims, 8 Drawing Sheets

(56) References Cited

U.S. PATENT DOCUMENTS

2009/0015234 A1 1/2009 Voisine et al.
2009/0124119 A1 5/2009 Austin
2010/0207604 A1* 8/2010 Bitsch et al. .............. 324/140 R

OTHER PUBLICATIONS

Author unknown, "LIBRA® Meter", Wasion Group Holdings Limited, www.wasion.com, accessed Nov. 9, 2009, 6 pages.

* cited by examiner

MECHANICAL PACKAGING AND METHOD FOR A SINGLE CURRENT SENSOR INTEGRATED INTO AN ELECTRICITY METER WITH A DISCONNECT SWITCH

TECHNICAL FIELD

The present invention relates to electricity meters. More particularly, the invention relates to mechanical packaging methods and apparatus for such meters.

BACKGROUND

Residential electric power consumption may be measured with electricity meters. These devices have long been priced as commodities, dependent on the extremely low cost of materials and volume manufacturing processes. Additionally, electricity meters are preferably compact in size.

A typical residential electricity meter on the market today has a meter base that interfaces with a residential socket. The meter base provides mounting for the meter's internal components, which may include one or more current sensors, one or more metering circuit boards, and other components. Some electricity meters are provisioned with disconnect switches that may be remotely operated by a utility to disconnect a location (and its loads) from the power line. In some cases, the disconnect switch is provided in a separate enclosure external to the meter. Given the cost and size limitations of electricity meters, it can be difficult to provide a disconnect switch within the housing of an electricity meter.

SUMMARY

An electricity meter comprises a single current sensor comprising a toroidal coil having an inner bore extending substantially centrally therethrough, the inner bore having a first end and a second end. The electricity meter has a first current conductor and a second current conductor, wherein each of the first and second current conductors has a first end and a second end, the first end of each current conductor forming a respective one of a pair of line-side or load-side blades of the meter. The meter also has a disconnect switch having a pair of moveable contacts and a pair of fixed contacts, one of the pairs of contacts of being electrically connected to the respective second ends of the first and second current conductors, and the other pair of contacts forming respective opposite load-side or line-side blades of the meter. The first current conductor passes through the inner bore of the current sensor in a first direction relative to its line-side blade and the second current conductor passes through the inner bore of the current sensor in a substantially opposite direction relative to its line-side blade, such that during operation of the meter electrical current passing through the first and second current conductors passes through the inner bore of the current sensor in a same direction.

In one embodiment, a dielectric cover is disposed over the toroidal coil of the current sensor. The dielectric cover may further comprise a web material disposed within the inner bore of the coil and having cutout guides that fit the first and second current conductors to hold them in place within the inner bore.

Additionally, in another embodiment, the first current conductor and the second current conductor may have substantially the same shape. Particularly, this shape may include a relatively planar first surface forming the first end of the conductor, a relatively planar second surface attached at an approximately 90 degree angle to the first surface, a relatively planar third surface attached at an approximately 90 degree angle to the second surface, and a relatively planar fourth surface attached at an approximately 90 degree angle to the third surface, such that the first and fourth surfaces are substantially parallel, the relatively planar fourth surface forming the second end of the conductor.

In yet another embodiment, the moveable contacts of the disconnect switch may comprise spring arms actuated by a cam member and adapted to provide an electrical connection between the line-side blades of the meter and the fixed contacts of the disconnect switch that define the load-side blades of the meter when the switch is in a closed position and to interrupt the electrical connection when the switch is in an open position.

A method of measuring current using the apparatus described above, and a method of assembling such electricity meter are also contemplated herein. Other features will become evident from the following description and accompanying figures.

BRIEF DESCRIPTION OF THE DRAWINGS

The foregoing summary, as well as the following detailed description, are better understood when read in conjunction with the appended drawings in which exemplary, non-limiting embodiments are illustrated. In the drawings.

DETAILED DESCRIPTION OF ILLUSTRATIVE EMBODIMENTS

FIGS. 1-10 illustrate one embodiment of a mechanical packaging assembly and method for integrating a single current sensor and a disconnect switch in an electricity meter.

Figure 1:
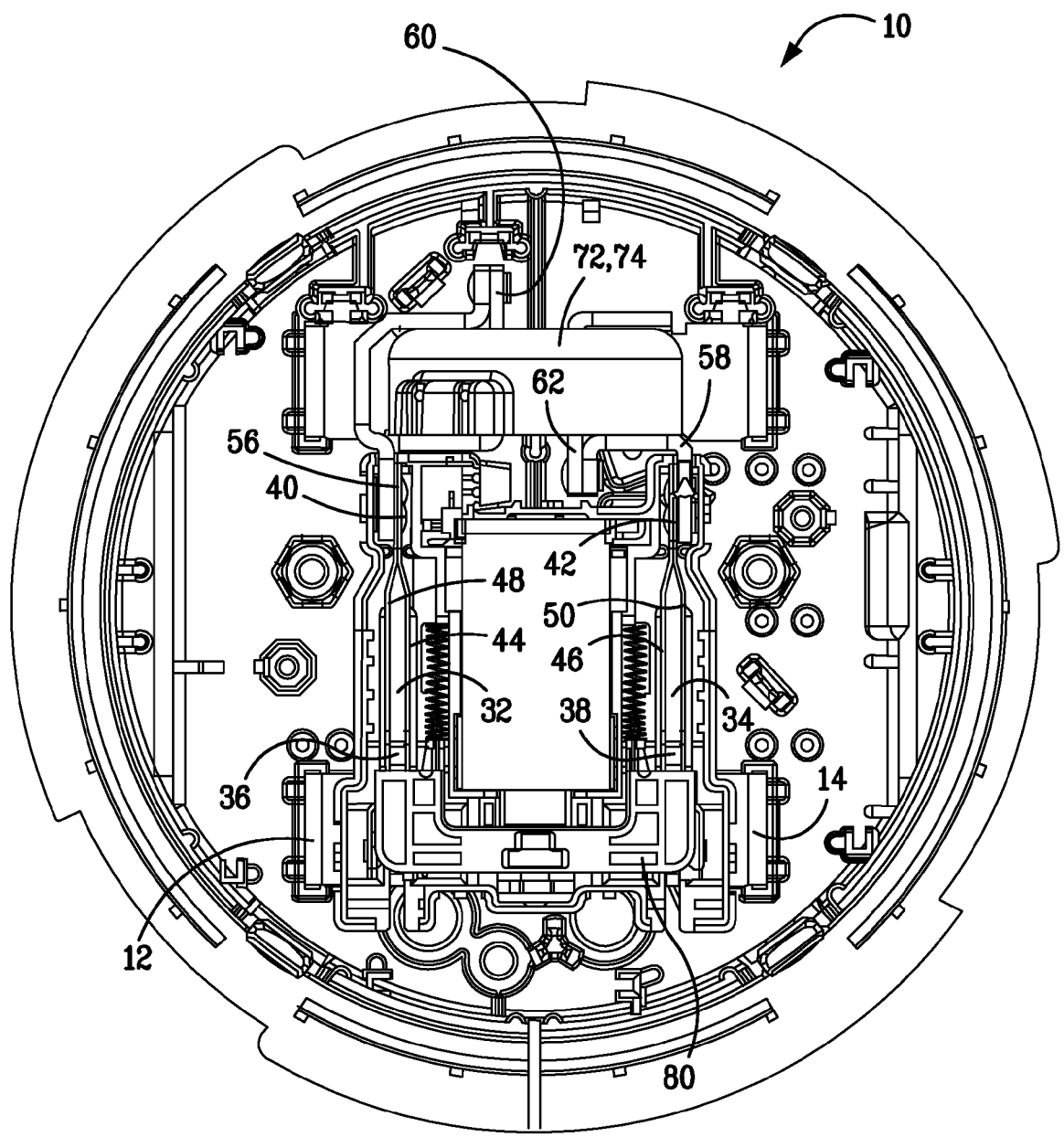
FIG. 1 is a top view of a base of an electricity meter with its cover (not shown) removed.
Figure 2:
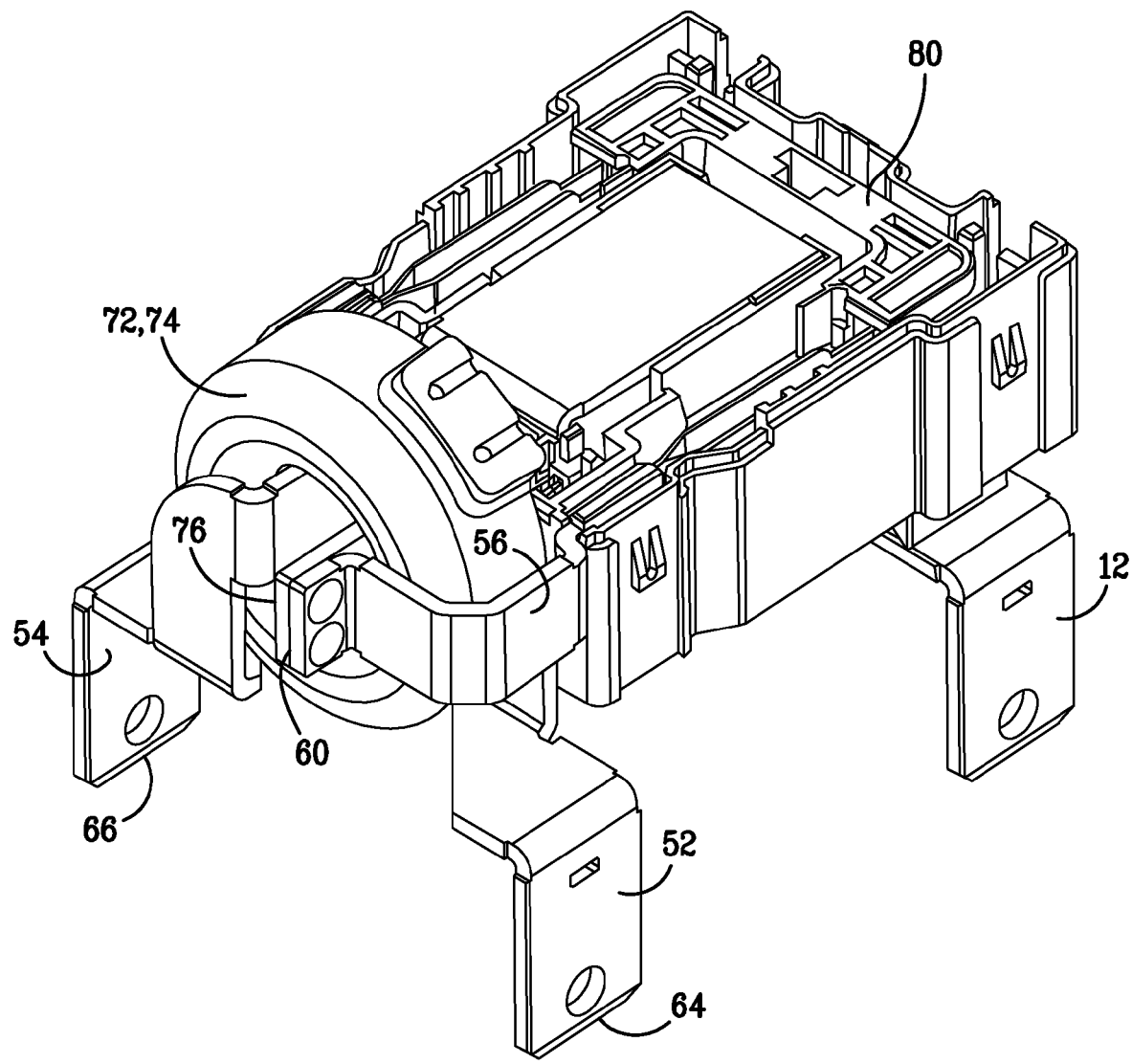
FIG. 2 is a partial perspective view of the electricity meter shown in FIG. 1 with portions cut away.

In particular, FIGS. 1 and 2 show a base of an electricity meter 10 with its cover (not shown) removed. In one embodiment, the electricity meter 10 comprises a single current sensor 72, a disconnect switch 80, and first and second current conductors 52, 54. The single current sensor may comprise a toroidal coil (not shown) having an inner bore 76 extending substantially centrally therethrough and having a first end and a second end. Each of the first and second current conductors 52, 54 has a first end 64, 66 and a second end 60, 62, and the first end 64, 66 of each current conductor forms a respective one of a pair of line-side blades of the meter (see FIG. 10).

In the illustrated embodiment, the disconnect switch 80 has a pair of moveable contacts 32, 34 and a pair of fixed contacts 12, 14. Each of the moveable contacts 32, 34 is electrically connected to the second end 60, 62 of a respective one of the first and second current conductors 52, 54, and each of the fixed contacts 12, 14 forms a respective load-side blade of the meter (see FIG. 10).

Figure 3:
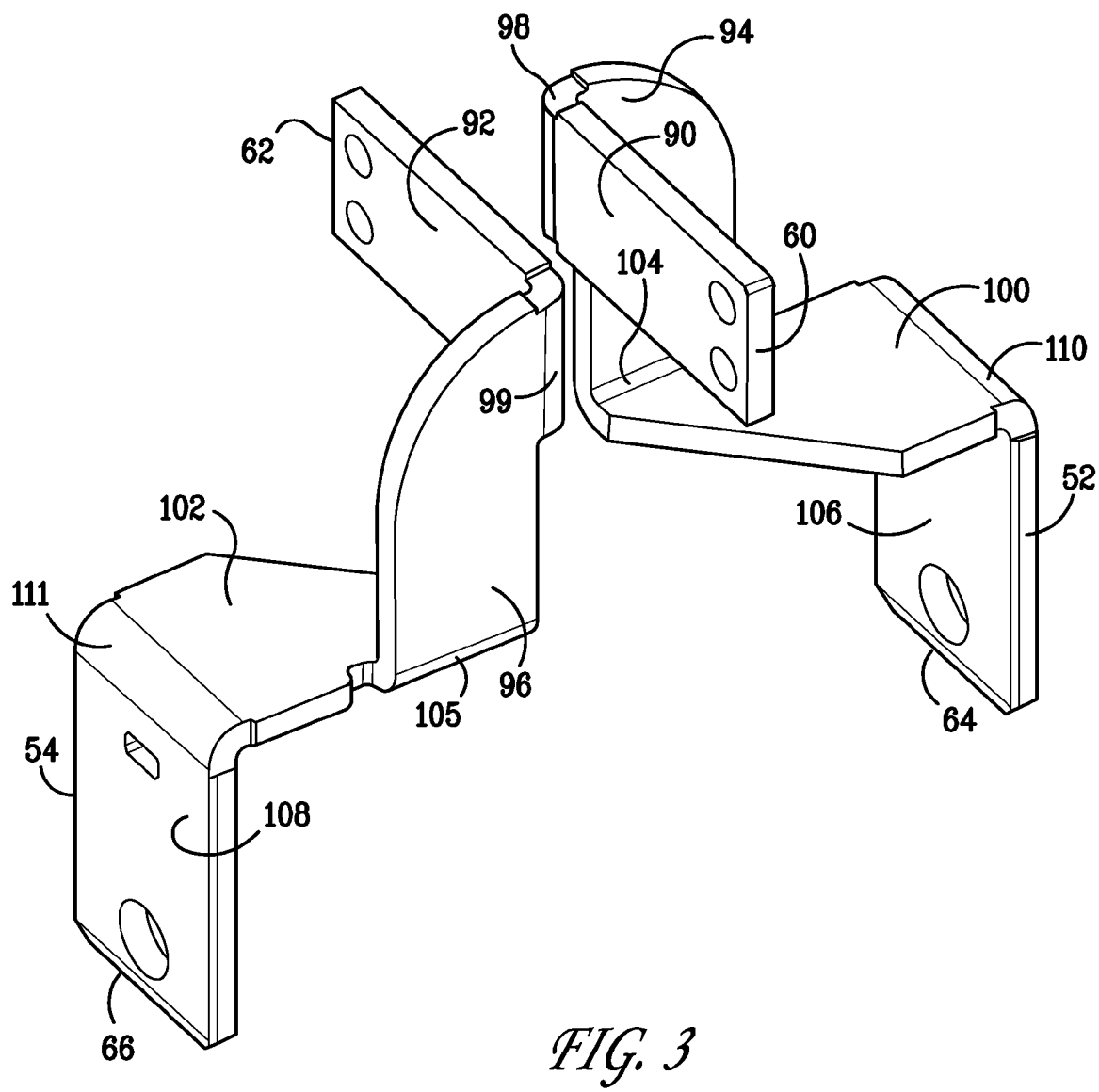
FIG. 3 is a perspective view of the current conductors of the electricity meter shown in FIG. 1.

In the present embodiment, as shown best in FIG. 3, the second end 60 of the first current conductor 52 passes through the inner bore 76 of the current sensor 72 in a first direction relative to its first end 64 (line-side blade), and the second end 62 of the second current conductor 54 passes through the inner bore 76 of the current sensor 72 in a substantially opposite direction relative to its first end 66 (line-side blade), such that during operation of the meter, electrical current passing through the first and second current conductors 52, 54 may passes through the inner bore of the current sensor 72 in a same direction.

Figure 6:
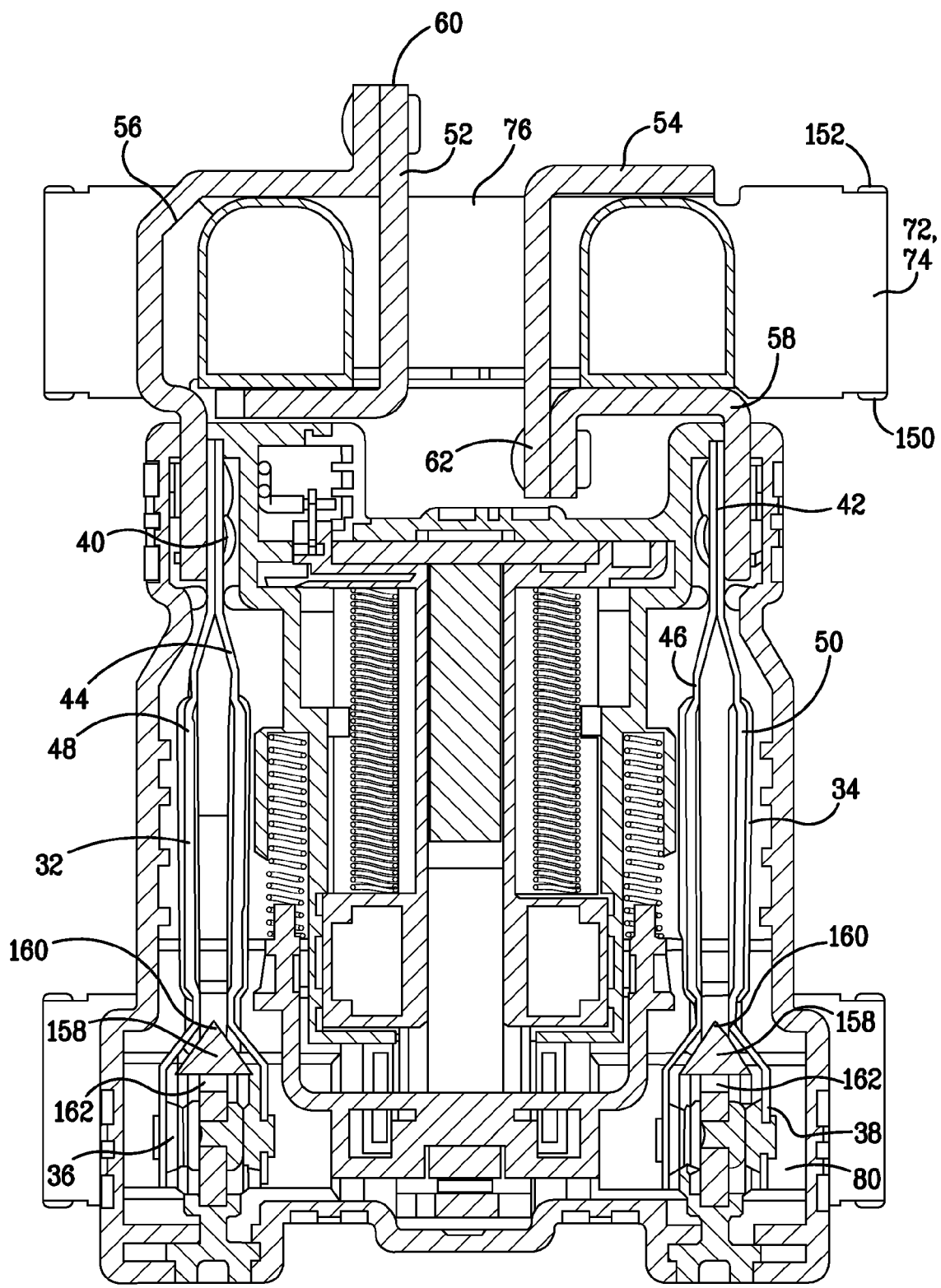
FIG. 6 is a cross sectional view of the electricity meter as seen from line 6-6 of FIG. 5.

Referring to FIGS. 1 and 6, in the present embodiment, each of the movable contacts 32, 34 has a first end 40, 42 and a second end 36, 38. The first end 40, 42 of each moveable contact is connected to a respective one of the second ends 60, 62 of the first and second conductors 52, 54. Specifically, the first end 40 of moveable contact 32 is connected to the second end 60 of the first conductor 52 by a connector piece 56, and the first end 42 of moveable contact 34 is connected to the second end 62 of the second conductor 54 by a connector piece 58.

The second end 36, 38 of each moveable contact 32, 34 is designed to engage a respective one of the fixed contact 12, 14 depending on the operating state of the disconnect switch. For example, when the disconnect switch is in a "closed" position, the second end 36, 38 of each moveable contact 32, 34 is in electrical connection with its respective one of the fixed contacts 12, 14. When the switch is in an "open" position, then the second end 36, 38 of each moveable contact 32, 34 is moved to a position that breaks the electrical connection with the respective fixed contacts 12, 14. Thus, when the disconnect switch is in the "closed" position, current may flow between the line-side blades 64, 66 and the load-side blades 12, 14 of the meter. However, when the switch is in the "open" position, current flow between the line-side blades and the load-side blades is interrupted.

In other embodiments, the line-side and load-side blades may be defined differently. For example, the first and second conductors 52, 54 could be connected, respectively, to the fixed contacts 12, 14 instead. The moveable contacts 32, 34 could then form the load-side blades. Alternatively, the first ends 64, 66 of the first and second conductors 52, 54 could form the load-side blades and the contacts of the disconnect switch 80 could form the line-side blades.

As further shown, in one embodiment, the movable contacts 32, 34 of the disconnect switch may each comprise a respective pair of spring loaded arms. In particular, moveable contact 32 may comprise an inner spring loaded arm 44 and an outer spring loaded arm 48. Moveable contact 34 similarly may comprise an inner spring loaded arm 46, and an outer spring loaded arm 50. As described above, the ends 40, 42 of each pair of spring arms are fixedly connected to the respective ends 60, 62 of the first and second connectors 52, 54 by respective connector pieces 56, 58. The other ends 36, 38 of each pair of spring arms move into and out of engagement with the respective fixed contacts 12, 14, depending on the operating state of the disconnect switch. FIG. 6 shows each pair of spring arms 44, 48 and 46, 50 when the switch is in its closed position, i.e., the spring arms are in contact with the fixed contacts 12, 14. In this embodiment, the switch is "opened" by causing each pair of spring arms 44, 48 and 46, 50 to spread apart such that the ends of each spring arm are no longer in electrical contact with the respective fixed contacts 12, 14. In this embodiment, this is accomplished by cam members 158 positioned between each pair of spring arms. The cam members 158 are moved back and forth along a z-axis of the switch by operation of a solenoid. Specifically, in response to an electrical signal to "open" the switch, the solenoid will cause the cams 158 to move towards the current sensor 72 along the z-axis. The tip 160 of each cam 158 has a generally triangular shape that fits between the inner and outer arms of each pair of spring arms. As the tip 160 of each cam moves along the z-axis in the direction of the current sensor, the base 162 of each triangular tip forces the separation of the inner and outer arms of each pair of spring arms. As each pair of spring arms separates, the electrical connection with its respective fixed contact 12, 14 is broken, thereby "opening" the switch.

The signal that is applied to the solenoid to cause the cams 158 to move may be provided by a microprocessor (not shown) or other control device within the electricity meter. The microprocessor may generate the solenoid control signal when instructed to do so by a technician operating the meter at a customer site, or in response to a communication or instruction received by the meter from a remote location, such as a utility control station.

It will be appreciated that there may be many alternative configurations for disconnect switch 80. Any device that is capable of severing the electrical connection in electricity meter 10 may be employed.

The moveable contacts 32, 34 may, in one embodiment, be comprised of beryllium copper. It will be appreciated that other materials may be used to form the moveable contacts including hard drawn copper, phosphor bronze, or other copper alloys.

The current sensor 72 produces a signal proportional to the amount of current flowing through the first and second conductors 52, 54, which signal is then used by the electricity meter 10 to determine energy consumption. For example, a microprocessor (not shown) within the meter may calculate energy consumption base in part on the signal produced by the current sensor. In one embodiment, the current sensor 72 comprises a toroidal coil (not shown) that is disposed within a dielectric cover 74 of the current sensor 72. The dielectric cover 74 may be comprised of a polycarbonate resin. The cover is formed by injection molding. It will be appreciated that other types of material may be used including plastic resins such as polybutylene terephthalate, or resin impregnated paper. Additionally, the cover may be formed by other means including compression molding or casting.

FIG. 3 shows current conductors 52, 54 in greater detail, in accordance with one embodiment. In this embodiment, the current conducts 52, 54 are substantially identical in shape. It is understood, however, that in other embodiments, the current conductors 52, 54 may not have the same shape.

In the embodiment shown in FIG. 3, the second end 60, 62 of each current conductor 52, 54 comprises a first, relatively planar surface 90, 92. The first surfaces 90, 92 are generally parallel to each other when the second end 60, 62 of each conductor 52, 54 is disposed within the bore 76 of the current sensor. First surfaces 90, 92 connect to second surfaces 94, 96 at approximately 90 degree angles such that the first surfaces 90, 92 and second surfaces 94, 96 are approximately perpendicular to each other. First surfaces 90, 92 and second surfaces 94, 96 connect to form edge 98, 99. Second surfaces 94, 96 connect to third surfaces 100, 102 at approximately 90 degree angles such that second surfaces 94, 96 and third surfaces 100, 102 are approximately perpendicular to each other. Second surfaces 94, 96 and third surfaces 100, 102 connect to form edge 104, 105. Fourth surfaces 106, 108 define the first ends 64, 66 of the current conductors 52, 54. Fourth surfaces 106, 108 connect to third surfaces 100, 102 at approximately 90 degree angles such that the third surfaces 100, 102 and the fourth surfaces 106, 108 are approximately perpendicular to each other. Fourth surfaces 106, 108 and third surfaces 100, 102 connect to form edges 110, 111. As depicted in FIG. 3, fourth surfaces 106, 108 are substantially parallel to first surfaces 90, 92.

In the present embodiment, current conductors 52, 54 are made of copper and are formed by metal stamping. It will be appreciated that any material with similar properties may be used including alloys of copper or aluminum. Additionally, besides metal stamping, other methods of manufacturing may be used including sintered powdered metal, wire EDM, laser or waterjet cut from sheet material.

Figure 4:
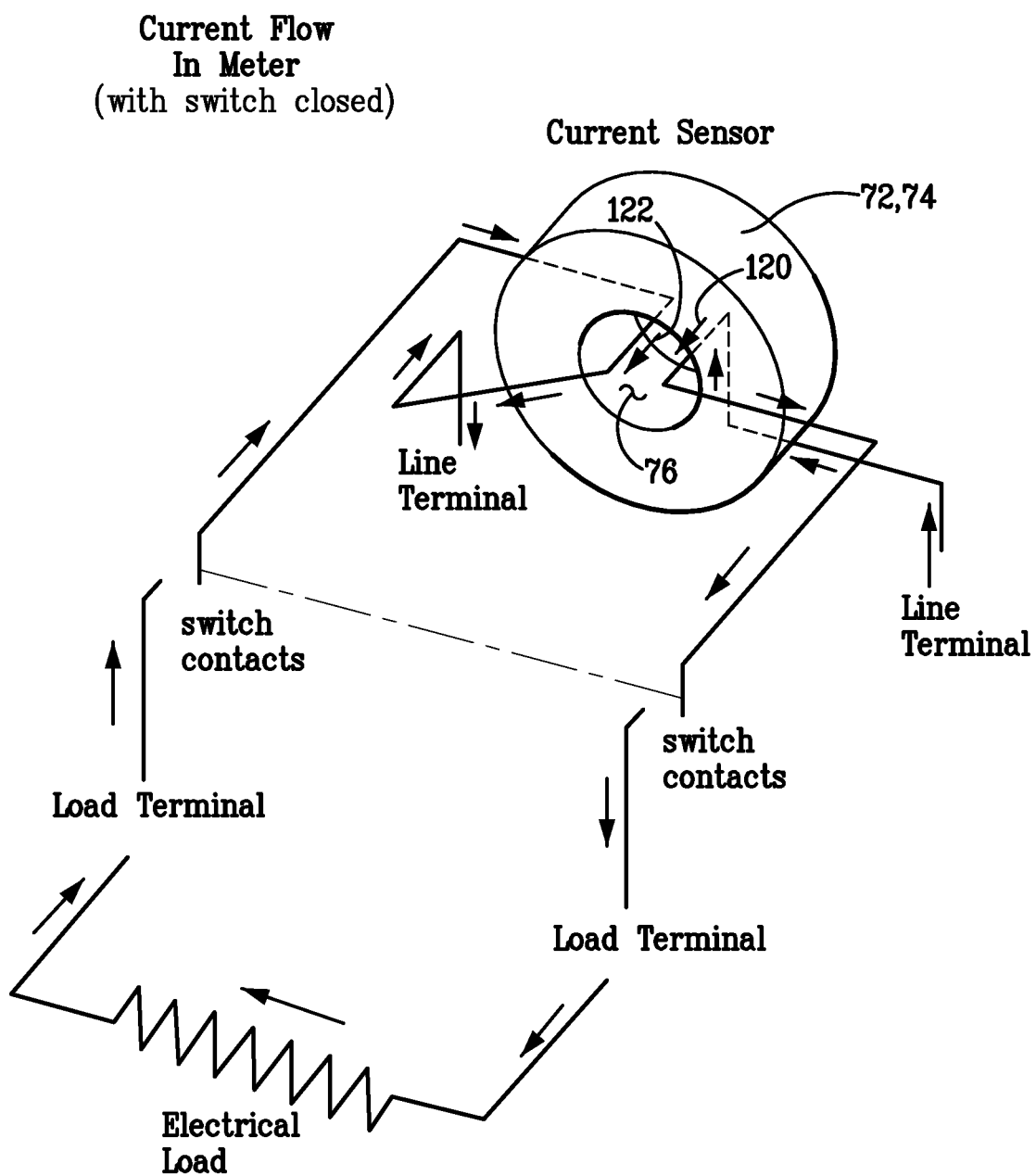
FIG. 4 is a schematic diagram illustrating current flow in the electricity meter shown in FIG. 1.

FIG. 4 is a schematic diagram illustrating current flow in the meter 10 under normal operating conditions and with the disconnect switch in its closed position. In typical residential applications, current flows through the first and second conducts between the line-side blades and load-side blades in opposition directions. However, in the present embodiment, because the second ends 60, 62 of the current conductors 52, 54 pass through the central bore of the current sensor in structurally opposing directions, current will pass through the bore of the current sensor 72 in the same direction. Thus, in the present embodiment, the configuration of the electricity meter 10 allows a single current sensor 72 to measure the current passing through the meter.

Figure 5:
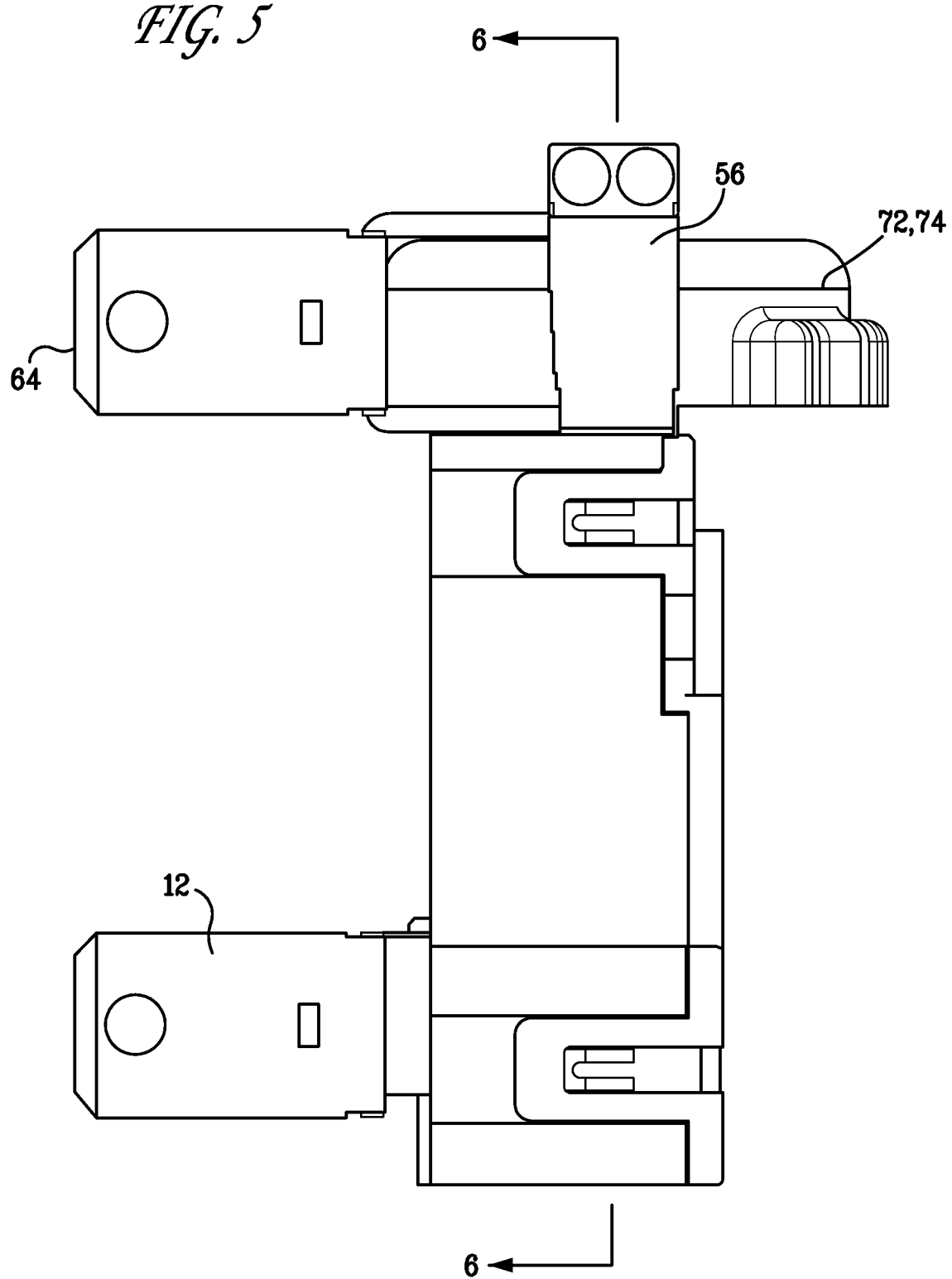
FIG. 5 is a partial side view of the electricity meter shown in FIG. 1 with portions cut away.

FIG. 6 provides a cross sectional view of the meter 10 taken along line A-A of FIG. 5, showing further details of the present embodiment. For example, FIG. 6 shows that in the present embodiment, connector piece 58 is shown riveted to current conductor 54 along the inside edge 150 of the current sensor 72. Conversely, connector piece 56 wraps around the cover 74 of the current sensor 72 and is shown riveted to current conductor 54 along the outside edge 152 of the current sensor 72. This configuration allows for a more compact design.

There may be other ways in which to form and arrange the connector pieces 56, 58 and conductors 52, 54 so that current passes in the same direction through the conductors 52, 54 inside the bore 76 of the current sensor 72. For example, connector piece 58 may instead wrap around cover 74 and connector piece 56 may connect to conductor 52 along the inside edge 150. Alternatively, conductors 52, 54 may be formed in such a way to incorporate the shape of the connector pieces 56, 58.

Figure 7:
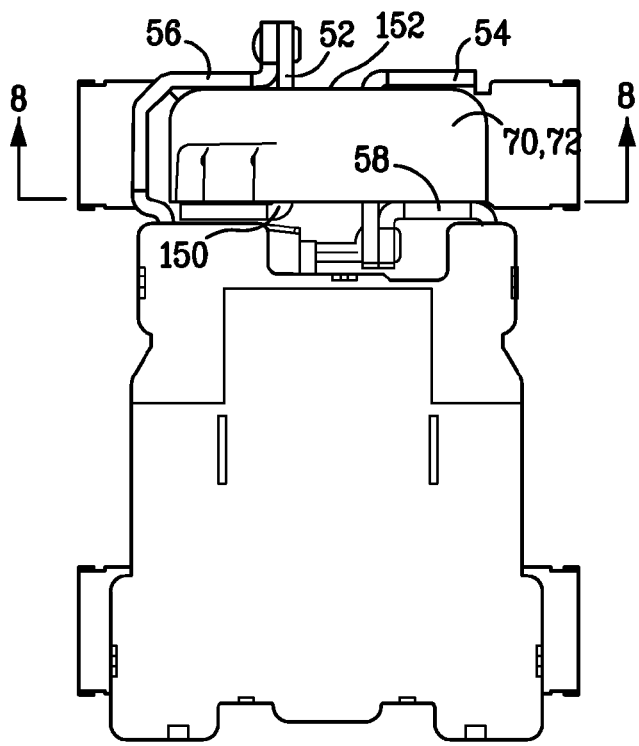
FIG. 7 is another partial top view of the electricity meter with portions cut away.
Figure 8:
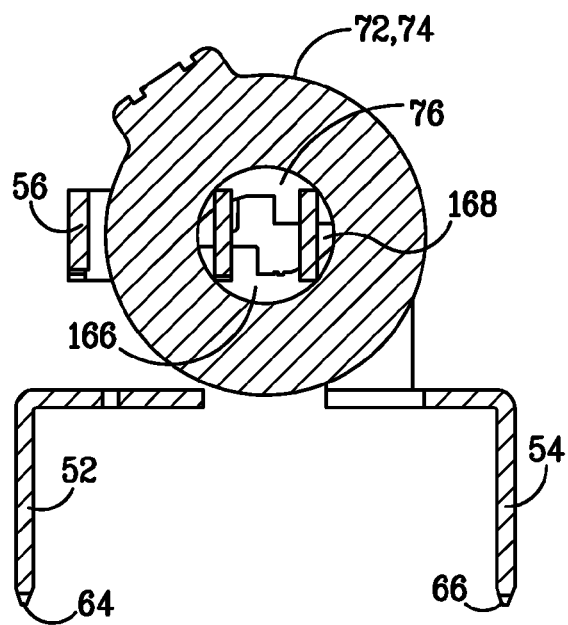
FIG. 8 is a cross sectional view of the electricity meter as seen from line 8-8 of FIG. 7.
Figure 9:
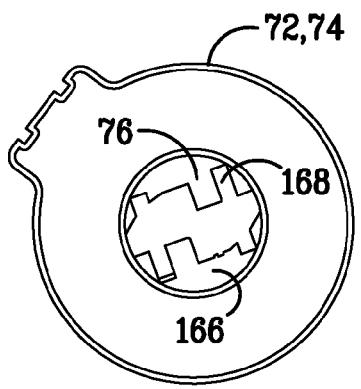
FIG. 9 is a front view of the toroidal current sensor shown in FIGS. 7 and 8.

FIGS. 7, 8, and 9 show one embodiment of the configuration of the bore 76 of current sensor 72. FIG. 8 shows the current sensor and conductors 52, 54 in a cross sectional view taken along line A-A. FIG. 8 also shows web material 166 that fits within the bore 76. As shown most clearly in FIG. 9, web 166 contains cutout guides 168. Cutout guides 168 of web 166 are configured so that conductors 52 can be snap-fitted into place within the bore 76 of current conductor 72. In the preferred embodiment, web material 166 is formed of a polycarbonate resin that is an integral part of the dielectric cover 74. However, any dielectric material with the necessary resilience and service properties will function similarly to allow conductors 52, 54 to fit into place. The web material may also be formed separately from the dielectric cover.

While FIGS. 8 and 9 show one possible configuration for cutout guides 168, other configurations are possible. Further, while the illustrated embodiment has cutouts that assist in holding the current sensor 72 and conductors 52, 54 in place, the cutouts are not required for functioning of the device and electricity connector 10 is usable without web material 166.

Figure 10:
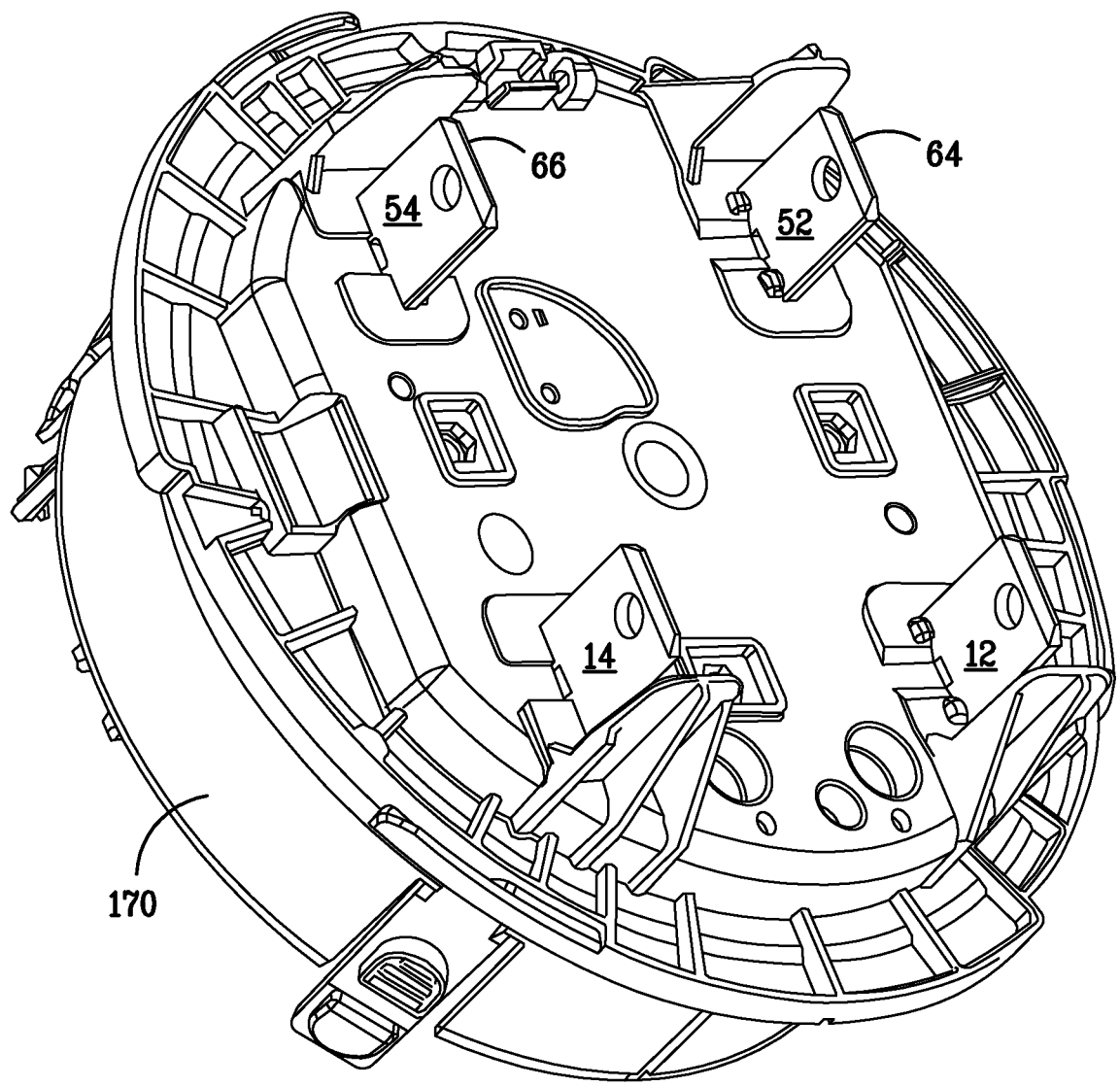
FIG. 10 is a perspective view of the bottom of the base of the electricity meter shown in FIG. 1.

FIG. 10 is a perspective view of the bottom of the base of the electricity meter 10. Line side blades 64, 66 and load side blades 12, 14 protrude from the base 170.

As can be appreciated from the foregoing description of the structure of the electricity meter 10, a method of assembling the meter 10 may comprise:

(1) providing the single current sensor 72;
(2) providing the first and second current conductors 52, 54, the first end of each current conductor forming a respective one of a pair of line-side blades of the meter;
(3) orienting the second end of each current conductor 52, 54 so that it extends through the inner bore 76 of the current sensor 72 and such that the second end of the first current conductor passes through the inner bore of the current sensor in a first direction relative to its first end (line-side blade) and the second end of the second current conductor passes through the inner bore of the current sensor in a substantially opposite direction relative to its first end (line-side blade);
(4) providing a disconnect switch 80 having a pair of moveable contacts 32, 34 and a pair of fixed contacts 12, 14, each of the fixed contacts forming a respective load-side blade of the meter; and
(5) electrically connecting each of the moveable contacts to the second end of a respective one of the first and second current conductors, such that during operation of the meter, electrical current passing through the first and second current conductors will pass through the inner bore of the current sensor in a same direction.

The method may further comprise current conductors manufactured from sheet metal materials by stamping using a punch and die. The manufacturing process may use a progressive action whereby a strip of material is indexed through a progression of successive metal forming and cutting stations such that with each stroke of the machine press a completed part is produced. In this same manner the current conductors can be formed by laminating thinner sheets of material locked together by features formed for the purpose. Another method of manufacturing the current conductors uses laser beams or abrasive jets to cut the material which is subsequently formed into the necessary shape.

While certain embodiments have been described above, it is understood that modifications and variations may be made without departing from the principles described above and set forth in the following claims. Accordingly, reference should be made to the following claims as describing the scope of the present invention.

What is claimed:

1. An electricity meter comprising:
    a single current sensor comprising a toroidal coil having an inner bore extending substantially centrally therethrough, the inner bore having a first end and a second end;
    a first current conductor and a second current conductor, wherein each of the first and second current conductors has a first end and a second end, the first end of each current conductor forming a respective one of a pair of line-side or load-side blades of the meter; and
    a disconnect switch having a pair of moveable contacts and a pair of fixed contacts, one of the pairs of contacts being electrically connected to respective second ends of the first and second current conductors, and the other pair of contacts forming opposite load-side or line-side blades of the meter,
    wherein the first current conductor passes through the inner bore of the current sensor in a first direction relative to its line-side blade and the second current conductor passes through the inner bore of the current sensor in a substantially opposite direction relative to its line-side blade, such that during operation of the meter electrical current passing through the first and second current conductors passes through the inner bore of the current sensor in a same direction.

2. The electricity meter of claim 1, further comprising a dielectric cover disposed over the coil of the current sensor.

3. The electricity meter of claim 1 wherein the first current conductor and the second current conductor have substantially the same shape.

4. The electricity meter of claim 2, wherein the first and second conductors each comprise:
a relatively planar first surface forming the first end of the conductor;
a relatively planar second surface attached at an approximately 90 degree angle to the first surface;
a relatively planar third surface attached at an approximately 90 degree angle to the second surface; and
a relatively planar fourth surface attached at an approximately 90 degree angle to the third surface, such that the first and fourth surfaces are substantially parallel, the relatively planar fourth surface forming the second end of the conductor.

5. The electricity meter of claim 2 wherein the dielectric cover comprises a web material disposed within the inner bore of the coil and having cutout guides that fit the first and second current conductors to hold them in place within the inner bore.

6. The electricity meter of claim 1 wherein the moveable contacts of the disconnect switch comprise spring arms actuated by a cam member and adapted to provide an electrical connection between the first and second current conductors and the fixed contacts of the disconnect switch when the switch is in a closed position and to interrupt the electrical connection when the switch is in an open position.

7. A method of assembling an electricity meter comprising:
positioning a single current sensor comprising a toroidal coil having an inner bore extending substantially centrally therethrough, the inner bore having a first end and a second end;
positioning a first current conductor and a second current conductor, wherein each of the first and second current conductors has a first end and a second end, the first end of each current conductor forming a respective one of a pair of line-side or load-side blades of the meter;
orienting the second end of each current conductor so that it extends through the inner bore of the current sensor, such that the second end of the first current conductor passes through the inner bore of the current sensor in a first direction relative to its line-side blade and the second end of the second current conductor passes through the inner bore of the current sensor in a substantially opposite direction relative to its line-side blade; and
positioning a disconnect switch having a pair of moveable contacts and a pair of fixed contacts, electrically connecting one of the pairs of contacts to the respective second ends of the first and second current conductors, and the other pair of contacts forming a respective opposite load-side or line side blade of the meter; and
wherein during operation of the meter, electrical current is configured to pass through the first and second current conductors within the inner bore of the current sensor in a same direction.

8. The method of claim 7 further comprising the step of forming the first and second current conductors by stamping.

9. The method of claim 7 further comprising the steps of positioning a web material and inserting the second end of each current conductor through guides of the web material to hold them in place.

10. The method of claim 8 wherein the step of forming the first and second current conductors by stamping further comprises:
forming a relatively planar first surface forming a line side end;
forming a relatively planar second surface attached at an approximately 90 degree angle to the first surface;
forming a relatively planar third surface attached at an approximately 90 degree angle to the second surface; and
forming a relatively planar fourth surface attached at an approximately 90 degree angle to the third surface, such that the first and fourth surfaces are substantially parallel.

11. An electricity meter comprising:
a single current sensor comprising a toroidal coil having an inner bore extending substantially centrally therethrough, the inner bore having a first end and a second end;
a first current conductor and a second current conductor, wherein each of the first and second current conductors has a first end and a second end, the first end of each current conductor forming a pair of line-side blades of the meter; and
a disconnect switch having a pair of moveable contacts and a pair of fixed contacts, one of the pairs of contacts being electrically connected to the respective second ends of the first and second current conductors, and the other pair of contacts forming load-side blades of the meter,
wherein the first current conductor passes through the inner bore of the current sensor in a first direction relative to its line-side blade and the second current conductor passes through the inner bore of the current sensor in a substantially opposite direction relative to its line-side blade, such that during operation of the meter electrical current passing through the first and second current conductors passes through the inner bore of the current sensor in a same direction.

12. The electricity meter of claim 11, further comprising a dielectric cover disposed over the coil of the current sensor.

13. The electricity meter of claim 11 wherein the first current conductor and the second current conductor have substantially the same shape.

14. The electricity meter of claim 12, wherein the first and second conductors each comprise:
a relatively planar first surface forming the first end of the conductor;
a relatively planar second surface attached at an approximately 90 degree angle to the first surface;
a relatively planar third surface attached at an approximately 90 degree angle to the second surface; and
a relatively planar fourth surface attached at an approximately 90 degree angle to the third surface, such that the first and fourth surfaces are substantially parallel, the relatively planar fourth surface forming the second end of the conductor.

15. The electricity meter of claim 12 wherein the dielectric cover comprises a web material disposed within the inner bore of the coil and having cutout guides that fit the first and second current conductors to hold them in place within the inner bore.

16. The electricity meter of claim 11 wherein the moveable contacts of the disconnect switch comprise spring arms actuated by a cam member and adapted to provide an electrical connection between the line-side blades of the meter and the fixed contacts of the disconnect switch that define the load-side blades of the meter when the switch is in a closed position and to interrupt the electrical connection when the switch is in an open position.

17. The method of claim 7 wherein the step of positioning the first current conductor and the second current conductor further comprises positioning the first conductor and the second conductor that each have:
- a relatively planar first surface forming a line side end;
- a relatively planar second surface attached at an approximately 90 degree angle to the first surface;
- a relatively planar third surface attached at an approximately 90 degree angle to the second surface; and
- a relatively planar fourth surface attached at an approximately 90 degree angle to the third surface, such that the first and fourth surfaces are substantially parallel.

\* \* \* \* \*

UNITED STATES PATENT AND TRADEMARK OFFICE
CERTIFICATE OF CORRECTION

PATENT NO.         : 8,564,280 B2
APPLICATION NO.    : 13/017619
DATED              : October 22, 2013
INVENTOR(S)        : Loy It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 324 days.

Signed and Sealed this
Seventh Day of April, 2015

Michelle K. Lee
*Director of the United States Patent and Trademark Office*